United States Patent
Yen et al.

(10) Patent No.: US 11,011,219 B2
(45) Date of Patent: May 18, 2021

(54) METHOD FOR REFRESHING A MEMORY ARRAY

(71) Applicant: NANYA TECHNOLOGY CORPORATION, New Taipei (TW)

(72) Inventors: Nung Yen, Taoyuan (TW); Yu-Hsiang Liu, Taoyuan (TW)

(73) Assignee: Nanya Technology Corporation, New Taipei (TW)

(*) Notice: Subject to any disclaimer, the term of this patent is extended or adjusted under 35 U.S.C. 154(b) by 0 days.

(21) Appl. No.: 16/906,333

(22) Filed: Jun. 19, 2020

(65) Prior Publication Data

US 2020/0321050 A1     Oct. 8, 2020

Related U.S. Application Data

(62) Division of application No. 16/138,020, filed on Sep. 21, 2018, now Pat. No. 10,726,903.

(51) Int. Cl.
*G11C 7/00* (2006.01)
*G11C 11/406* (2006.01)
*G11C 11/408* (2006.01)

(52) U.S. Cl.
CPC .... *G11C 11/40618* (2013.01); *G11C 11/4085* (2013.01); *G11C 11/4087* (2013.01)

(58) Field of Classification Search
CPC .......... G11C 11/40618; G11C 11/4085; G11C 11/4087
USPC ....................................................... 365/222
See application file for complete search history.

(56) References Cited

U.S. PATENT DOCUMENTS

| | | | |
|---|---|---|---|
| 9,472,260 B1* | 10/2016 | Kim | G11C 11/40618 |
| 9,620,194 B1 | 4/2017 | Lee et al. | |
| 9,685,240 B1* | 6/2017 | Park | G11C 11/4085 |
| 9,741,409 B2 | 8/2017 | Jones et al. | |
| 9,799,391 B1* | 10/2017 | Wei | G11C 11/40618 |
| 9,818,469 B1* | 11/2017 | Kim | G11C 11/4076 |
| 10,134,461 B2* | 11/2018 | Bell | G11C 11/406 |
| 10,147,472 B2 | 12/2018 | Jones et al. | |
| 10,388,363 B1 | 8/2019 | Ito | |
| 10,410,710 B2* | 9/2019 | Lee | G11C 29/76 |
| 10,475,503 B2* | 11/2019 | Yoo | G11C 11/40611 |
| 10,490,250 B1* | 11/2019 | Ito | G11C 11/40611 |
| 10,497,426 B1* | 12/2019 | Yen | G11C 8/08 |
| 10,580,475 B2* | 3/2020 | Morohashi | G11C 11/40622 |
| 10,607,683 B2* | 3/2020 | Shin | G11C 11/40618 |
| 10,685,696 B2* | 6/2020 | Brown | G11C 16/3431 |
| 10,726,903 B2* | 7/2020 | Yen | G11C 11/4085 |
| 10,770,127 B2* | 9/2020 | Shore | G11C 11/406 |
| 2005/0265104 A1 | 12/2005 | Remaklus, Jr. et al. | |
| 2014/0006703 A1* | 1/2014 | Bains | G11C 11/40611 |
| | | | 711/106 |
| 2014/0059287 A1 | 2/2014 | Bains et al. | |
| 2014/0089546 A1 | 3/2014 | Machnicki et al. | |
| 2014/0177347 A1 | 6/2014 | Chatterjee et al. | |

(Continued)

*Primary Examiner* — Viet Q Nguyen

(74) *Attorney, Agent, or Firm* — Muncy, Geissler, Olds & Lowe, P.C.

(57) ABSTRACT

The present disclosure provides a method for refreshing a memory array. The method includes the following steps: generating a plurality of target row records respectively for a plurality of banks; generating a plurality of row address records based on the plurality of target row records; and performing a row-hammer-refreshing process based on the plurality of row address records.

4 Claims, 15 Drawing Sheets

(56) References Cited

U.S. PATENT DOCUMENTS

| | | | |
|---|---|---|---|
| 2014/0177370 A1 | 6/2014 | Halbert et al. | |
| 2015/0003180 A1* | 1/2015 | Kim | G11C 11/40618 365/222 |
| 2015/0055420 A1 | 2/2015 | Bell et al. | |
| 2015/0109871 A1* | 4/2015 | Bains | G11C 11/408 365/222 |
| 2015/0200002 A1 | 7/2015 | Lin et al. | |
| 2016/0042782 A1 | 2/2016 | Narui et al. | |
| 2016/0086649 A1 | 3/2016 | Hong et al. | |
| 2016/0125931 A1* | 5/2016 | Doo | G11C 11/40626 365/222 |
| 2016/0163372 A1 | 6/2016 | Lee et al. | |
| 2016/0329089 A1* | 11/2016 | Lim | G11C 11/406 |
| 2017/0117030 A1* | 4/2017 | Fisch | G11C 29/06 |
| 2017/0263305 A1 | 9/2017 | Cho | |
| 2017/0352404 A1* | 12/2017 | Lee | G11C 11/408 |
| 2018/0005690 A1* | 1/2018 | Morgan | G11C 11/408 |
| 2018/0082736 A1 | 3/2018 | Jung | |
| 2018/0090227 A1 | 3/2018 | Lee et al. | |
| 2018/0114561 A1 | 4/2018 | Fisch et al. | |
| 2018/0158507 A1 | 6/2018 | Bang | |
| 2018/0261268 A1* | 9/2018 | Hyun | G11C 7/1087 |
| 2018/0342282 A1 | 11/2018 | Morgan | |
| 2019/0087127 A1* | 3/2019 | Kim | G06F 11/0727 |
| 2019/0228813 A1 | 7/2019 | Nale et al. | |
| 2019/0228815 A1* | 7/2019 | Morohashi | G11C 11/40611 |
| 2019/0267077 A1 | 8/2019 | Ito et al. | |
| 2019/0348107 A1* | 11/2019 | Shin | G11C 8/12 |
| 2020/0211634 A1* | 7/2020 | Ishikawa | G11C 11/4087 |

* cited by examiner

METHOD FOR REFRESHING A MEMORY ARRAY

CROSS-REFERENCE TO RELATED APPLICATION

This application is a divisional application of U.S. Non-Provisional application Ser. No. 16/138,020 filed Sep. 21, 2018, which is incorporated herein by reference in its entirety.

TECHNICAL FIELD

The present disclosure relates to a circuit, a dynamic random access memory (DRAM) and a method for refreshing a memory array, and more particularly, to a row-determining circuit, a DRAM and a method for refreshing the memory array.

DISCUSSION OF THE BACKGROUND

A DRAM tends to have high cell density, which causes row hammer problems to occur. When a row of the DRAM is repeatedly activated, charges of the row may leak and interact electrically with an adjacent row, causing the adjacent row, which is not desired to be activated, to experience a bit flipping phenomenon. Generally, a row that suffers from a row hammer problem is regarded as a stressed row.

One way to solve the row hammer problem is to refresh the stressed row. However, most conventional methods to refresh the stressed row have low refreshing efficiency.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a row-determining circuit. The row-determining circuit comprises a plurality of row latches and a target row generator connected to the plurality of row latches. The target row generator is configured to generate a plurality of target row records respectively for a plurality of banks. In some embodiments, the target row generator is configured to send the plurality of target row records respectively to the plurality of row latches, and the plurality of row latches are configured to generate a plurality of row address records based on the plurality of target row records.

In some embodiments, the target row generator includes a counting unit configured to determine a plurality of target rows respectively for the plurality of banks.

In some embodiments, the counting unit is configured to count stressed times respectively for the plurality of target rows.

In some embodiments, the target row generator further includes a processing unit connected between the counting unit and the plurality of row latches, wherein the processing unit is configured to generate the plurality of target row records.

In some embodiments, each of the plurality of row latches is configured to generate a row address record based on a corresponding one of the plurality of target row records.

In some embodiments, the row-determining circuit further comprises a row address multiplexer connected to the plurality of row latches, wherein the row address multiplexer is configured to generate an auto-refreshing row address.

In some embodiments, the row-determining circuit further comprises an auto-refresh counter connected to the row address multiplexer, wherein the auto-refresh counter is configured to generate a counting signal to update the auto-refreshing row address.

Another aspect of the present disclosure provides a DRAM. The DRAM comprises a memory array and a row-determining circuit. The memory array includes a plurality of banks. The row-determining circuit is connected to the plurality of banks. In some embodiments, the row-determining circuit includes a plurality of row latches and a target row generator. The target row generator is configured to generate a plurality of target row records respectively for a plurality of banks. In some embodiments, the target row generator is configured to send the plurality of target row records respectively to the plurality of row latches, and the plurality of row latches are configured to generate a plurality of row address records based on the plurality of target row records.

In some embodiments, the target row generator includes a counting unit configured to determine a plurality of target rows respectively for the plurality of banks.

In some embodiments, the counting unit is configured to count stressed times respectively for the plurality of target rows.

In some embodiments, the target row generator further includes a processing unit connected between the counting unit and the plurality of row latches, wherein the processing unit is configured to generate the plurality of target row records.

In some embodiments, each of the plurality of row latches is configured to generate a row address record based on a corresponding one of the plurality of target row records.

In some embodiments, the DRAM further comprises a plurality of row decoders respectively connected to the plurality of row latches, wherein the plurality of row decoders are configured to activate a plurality of target rows based on a plurality of row address records.

In some embodiments, the DRAM further comprises a controlling module connected to the row decoders, wherein the controlling module is configured to control operations of the row decoders.

In some embodiments, the row-determining circuit further includes a row address multiplexer connected to the plurality of row latches, wherein the row address multiplexer is configured to generate an auto-refreshing row address.

In some embodiments, the row-determining circuit further includes an auto-refresh counter connected to the row address multiplexer, wherein the auto-refresh counter is configured to generate a counting signal to update the auto-refreshing row address.

Another aspect of the present disclosure provides a method for refreshing a memory array. The method comprises the following steps: generating a plurality of target row records respectively for a plurality of banks; generating a plurality of row address records based on the plurality of target row records; and performing a row-hammer-refreshing process based on the plurality of row address records.

In some embodiments, generating the plurality of target row records comprises counting stressed times respectively for a plurality of rows in the plurality of banks.

In some embodiments, the plurality of row address records direct to different rows in the plurality of banks.

In some embodiments, the row-hammer-refreshing process comprises activating a plurality of target rows in the plurality of banks based on the plurality of row address records With the above-mentioned configurations of the row-determining circuit, a row-hammer-refreshing process can be performed to refresh different rows in the plurality of banks for solving row hammer problems, and an efficiency of the row-hammer-refreshing process is thereby increased. Consequently, the disadvantages of a row-hammer-refreshing process can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
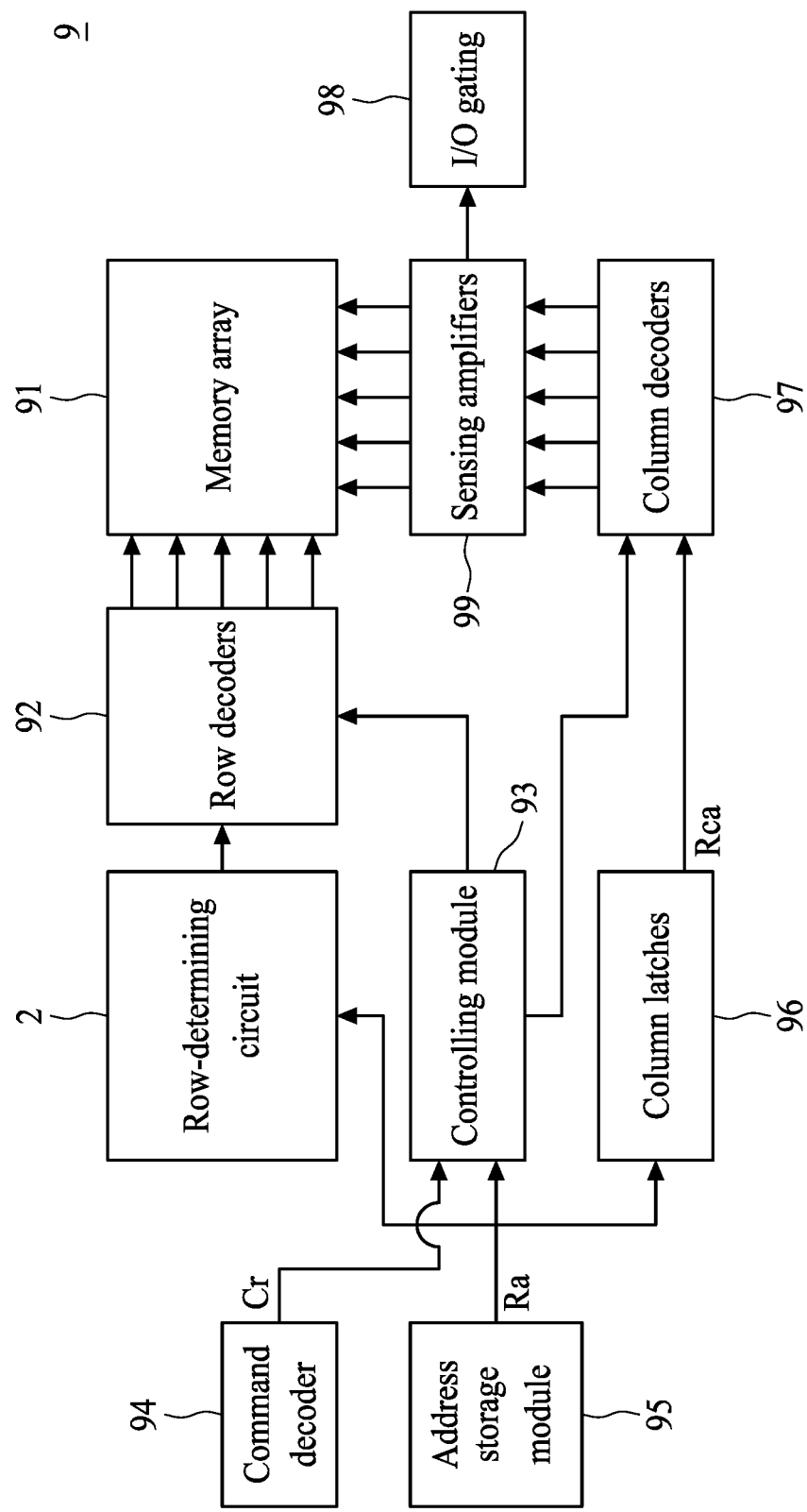
FIG. 1 is a block diagram of a DRAM in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a DRAM 9 in accordance with some embodiments of the present disclosure. Referring to FIG. 1, in some embodiments, the DRAM 9 includes a memory array 91, a plurality of row decoders 92, a controlling module 93, a command decoder 94, an address storage module 95, a plurality of column latches 96, a plurality of column decoders 97, an I/O gating 98, a plurality of sensing amplifiers 99 and a row-determining circuit 2.

Figure 2A:
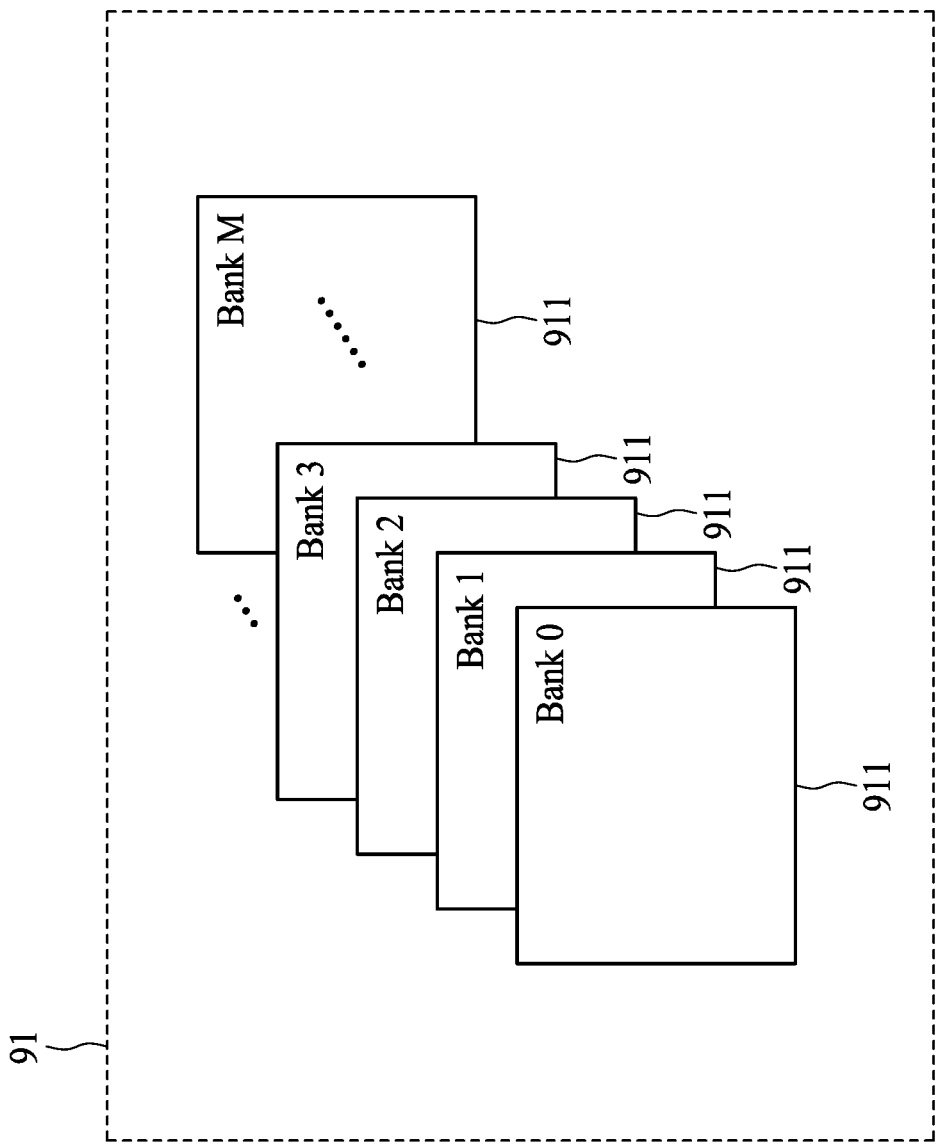
FIG. 2A is a schematic diagram illustrating a memory array of the DRAM in accordance with some embodiments of the present disclosure.
Figure 2B:
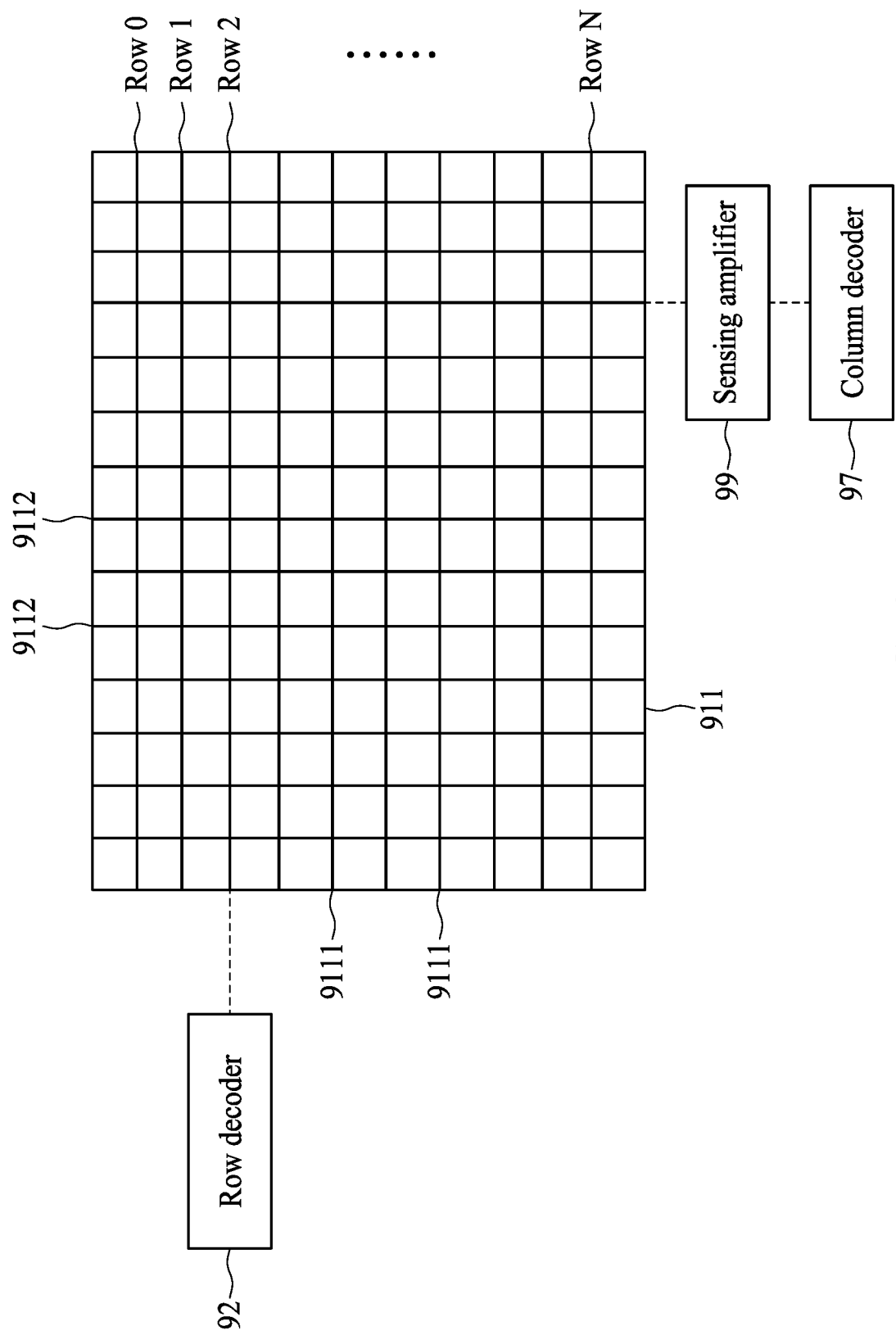
FIG. 2B is a schematic diagram illustrating a bank of the memory array in accordance with some embodiments of the present disclosure.

FIG. 2A is a schematic view illustrating the memory array 91 of the DRAM 9 in accordance with some embodiments of the present disclosure, and FIG. 2B is a schematic diagram illustrating a bank 911 of the memory array 91 in accordance with some embodiments of the present disclosure. Referring to FIG. 2A, in some embodiments, the memory array 91 includes a plurality of banks 911. Referring to FIG. 2B, in some embodiments, each of the plurality of banks 911 includes a plurality of rows 9111 and a plurality of columns 9112.

Figure 2C:
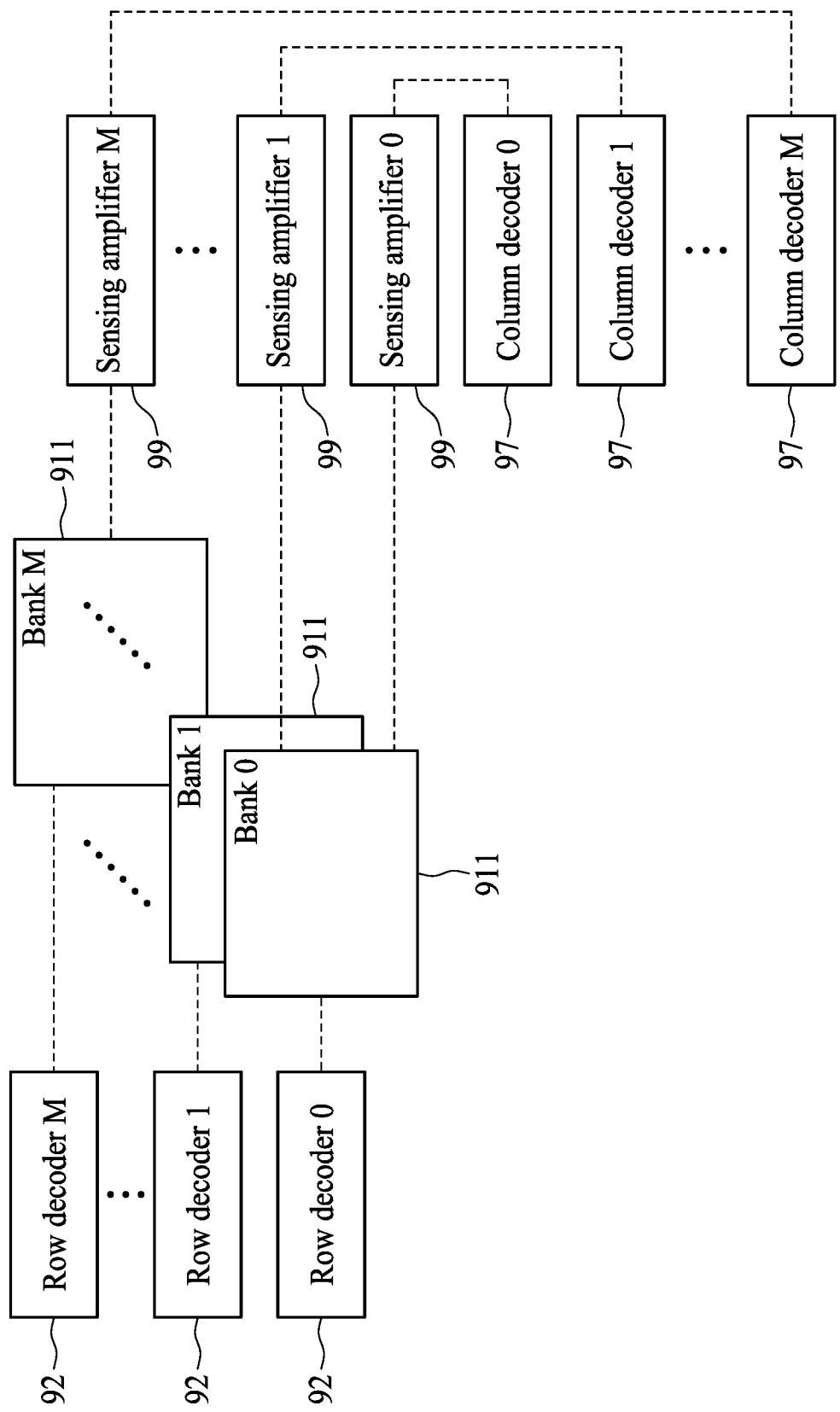
FIG. 2C is a schematic diagram illustrating a relationship between a plurality of banks and a plurality of row decoders, and a relationship between the plurality of banks and a plurality of column decoders in accordance with some embodiments of the present disclosure.

FIG. 2C is a schematic diagram illustrating a relationship between the plurality of banks 911 and the plurality of row decoders 92, and a relationship between the plurality of banks 911 and the plurality of column decoders 97 in accordance with some embodiments of the present disclosure. Referring to FIG. 2C, in some embodiments, the plurality of row decoders 92 are respectively connected to the plurality of banks 911, and each of the plurality of row decoders 92 is configured to activate a row 9111 (see FIG. 2B) of a corresponding one of the plurality of banks 911. In some embodiments, the sensing amplifiers 99 are respectively connected to the plurality of banks 911.

In some embodiments, the plurality of column decoders 97 are respectively connected to the plurality of sensing amplifiers 99, and each of the plurality of column decoders 97 is configured to activate a column 9112 (see FIG. 2B) of a corresponding one of the plurality of banks 911.

Referring back to FIG. 1, in some embodiments, the row-determining circuit 2 is connected between the address storage module 95 and the plurality of row decoders 92, and the row-determining circuit 2 is configured to determine which row 9111 (see FIG. 2B) of the corresponding one of the plurality of banks 911 (see FIG. 2A) is to be refreshed.

Referring to FIG. 1, in some embodiments, the controlling module 93 is connected to the plurality of row decoders 92 and the plurality of column decoders 97, and the controlling module 93 is configured to control operations of the plurality of row decoders 92 and the plurality of column decoders 97. The command decoder 94 is connected to the controlling module 93 and is configured to generate a refresh command (Cr). The address storage module 95 is connected to the row-determining circuit 2, the controlling module 93 and the plurality of column latches 96, and the address storage module 95 is configured to generate a plurality of address records (Ra). In some embodiments, the plurality of column latches 96 are respectively connected to the plurality of column decoders 97, and each of the plurality of column latches 96 is configured to generate a column address record (Rca). In some embodiments, the I/O gating 98 is connected to the plurality of sensing amplifiers 99, and is configured to input or output a data.

Referring to FIG. 1, in some embodiments, the address storage module 95 and the column latches 96 are configured as registers, while the configurations of the address storage module 95 and the column latches 96 may be varied in other embodiments.

Referring to FIG. 2A, in some embodiments, the number of banks in the plurality of banks 911 is defined as M. Referring to FIG. 2B, in some embodiments, the number of rows in the plurality of rows 9111 included in each of the plurality of banks 911 is defined as N. In other embodiments, the number of banks in the plurality of banks 911 and the number of rows in the plurality of rows 9111 included in each of the plurality of banks 911 may be varied.

Figure 3:
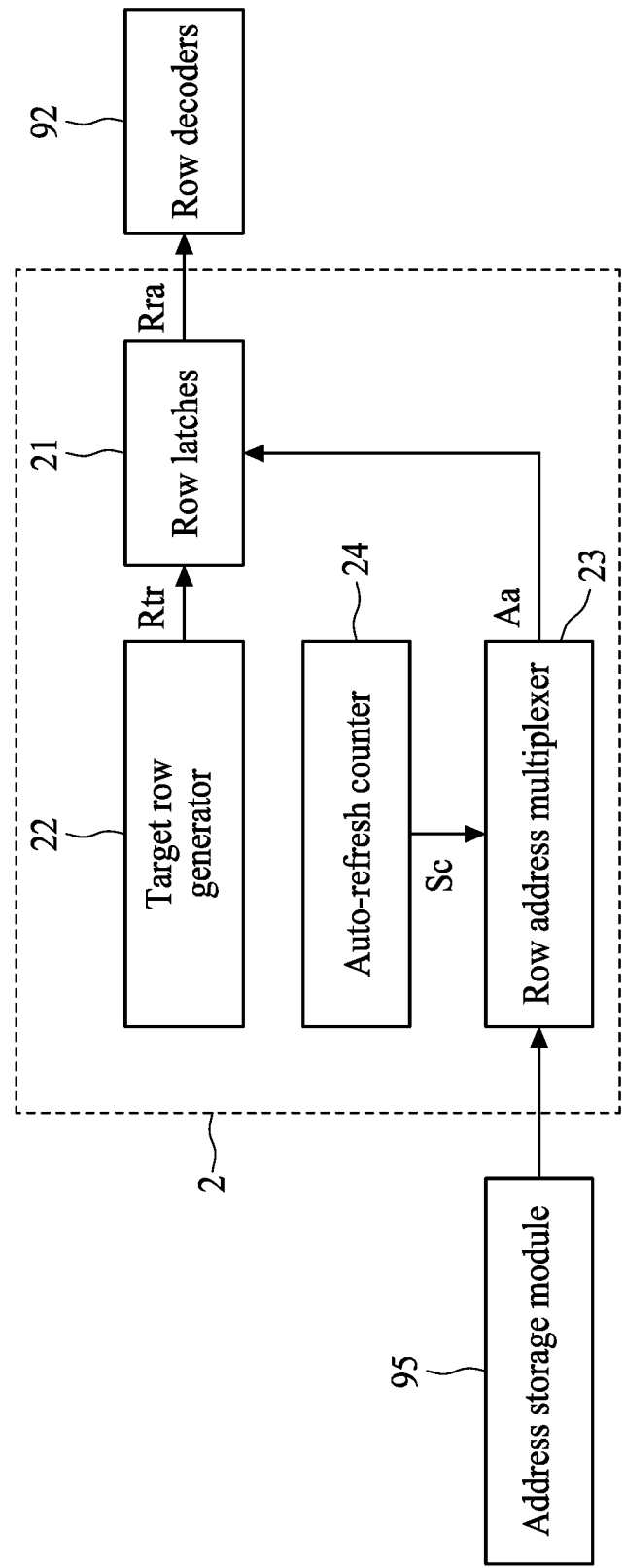
FIG. 3 is a block diagram illustrating a row-determining circuit of the DRAM in accordance with some embodiments of the present disclosure.

FIG. 3 is a block diagram illustrating the row-determining circuit 2 in accordance with some embodiments of the present disclosure. Referring to FIG. 3, in some embodiments, the row-determining circuit 2 includes a plurality of row latches 21, a target row generator 22, a row address multiplexer 23 and an auto-refresh counter 24. The plurality of row latches 21 are respectively connected to the plurality of row decoders 92, and each of the plurality of row latches 21 is configured to generate a row address record (Rra). The target row generator 22 is connected to the plurality of row latches 21 and is configured to generate a plurality of target row records (Rtr). The row address multiplexer 23 is connected to the plurality of row latches 21 and is configured to generate an auto-refreshing row address (Aa). The auto-refresh counter 24 is connected to the row address multiplexer 23 and is configured to generate a counting signal (Sc) to update the auto-refreshing row address (Aa).

Referring to FIG. 3, in some embodiments, the plurality of target row records (Rtr) are generated simultaneously, while such arrangement may be varied in other embodiments. In some embodiments, the plurality of row latches 21 are configured as registers, while, in other embodiments, the configurations of the plurality of row latches 21 may be varied.

Figure 4:
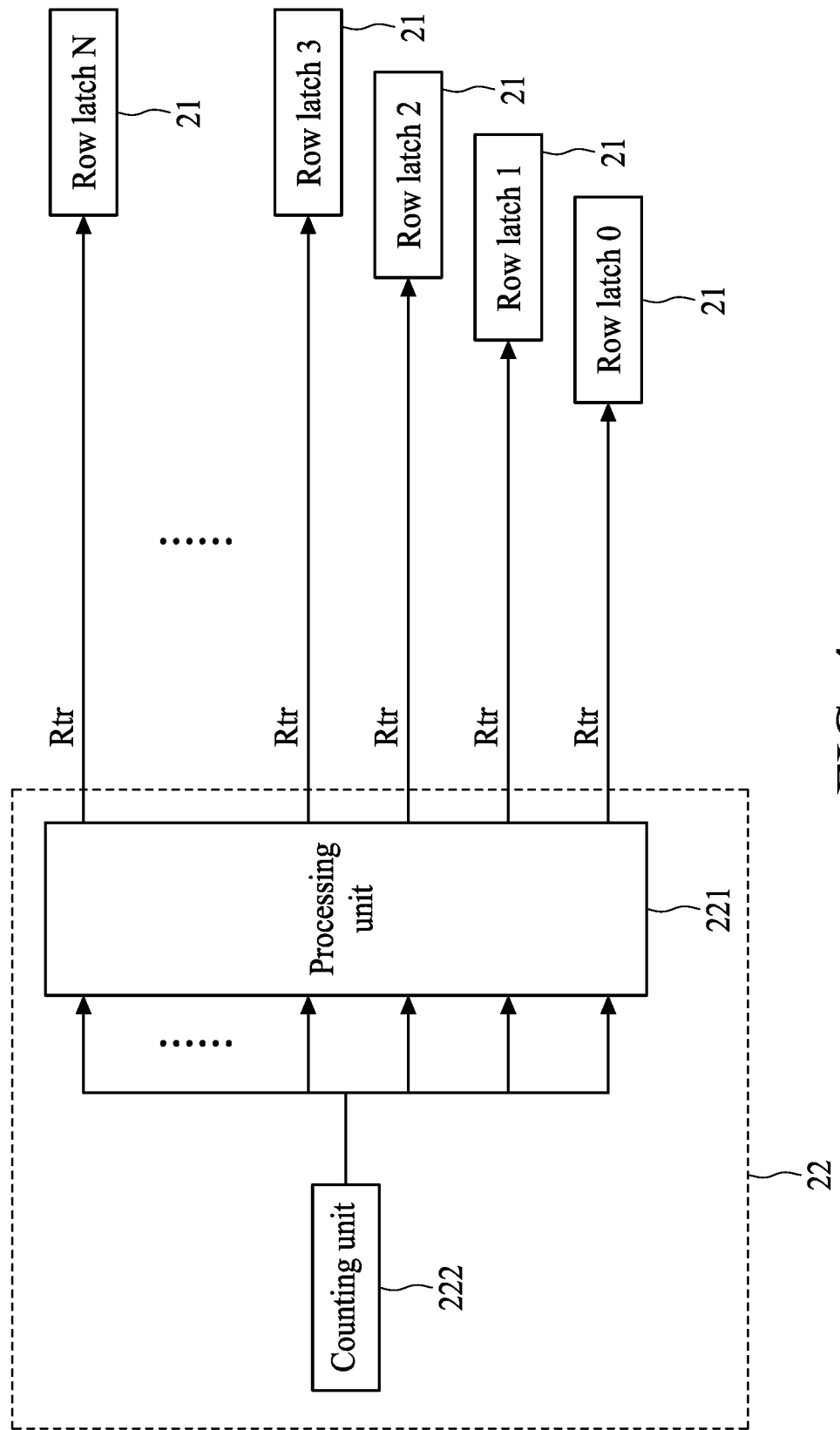
FIG. 4 is a block diagram illustrating a target row generator of the row-determining circuit in accordance with some embodiments of the present disclosure.

FIG. 4 is a block diagram illustrating the target row generator 22 of the row-determining circuit 2 in accordance with some embodiments of the present disclosure. Referring to FIG. 4, the target row generator 22 includes a processing unit 221 and a counting unit 222. The processing unit 221 is connected to the plurality of row latches 21 and is configured to generate the plurality of target row records (Rtr). The counting unit 222 is connected to the processing unit 221 and is configured to determine target rows (Tr).

Figure 5:
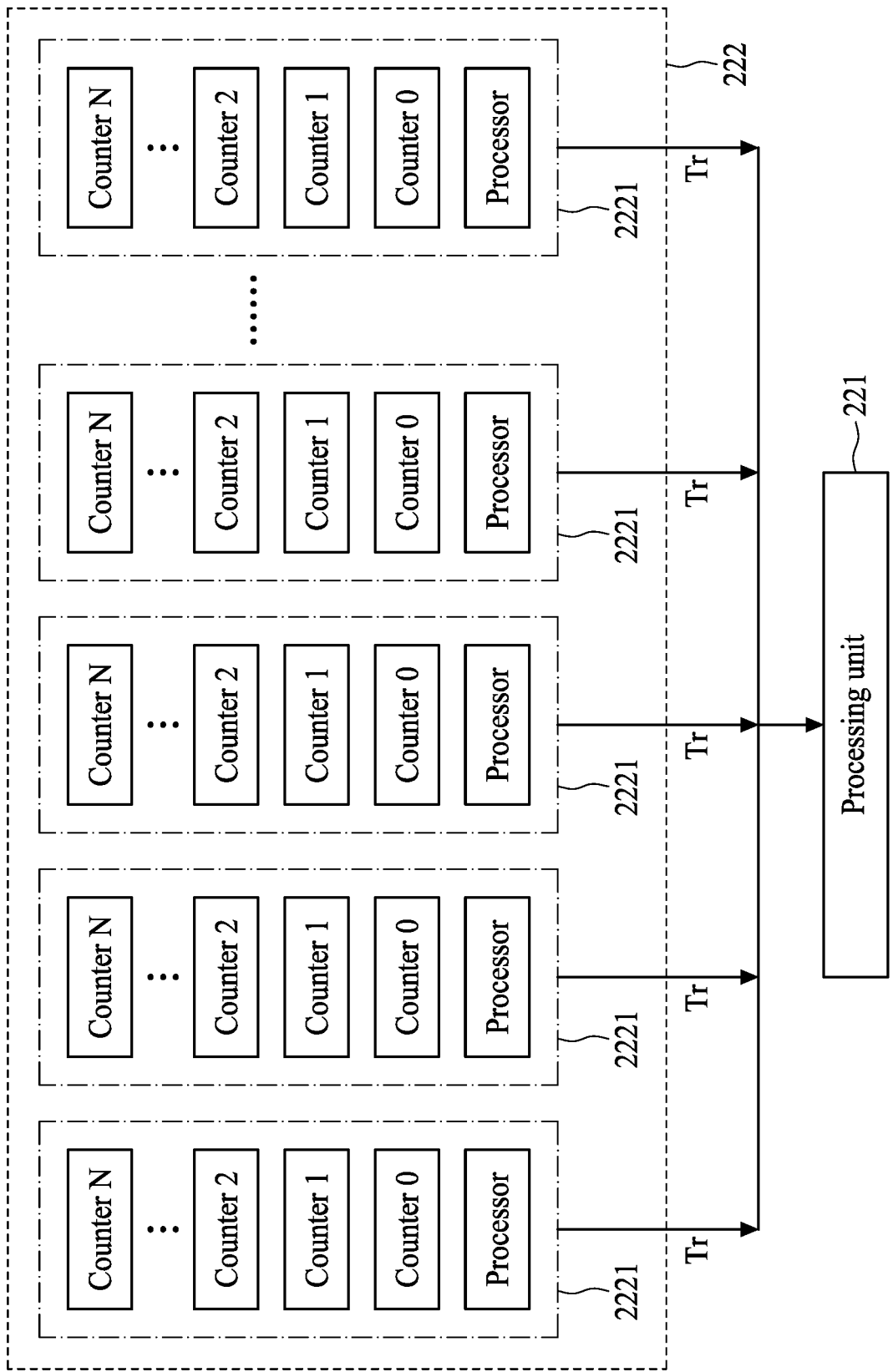
FIG. 5 is a block diagram illustrating a counting unit of the target row generator of the row-determining circuit in accordance with some embodiments of the present disclosure.

FIG. 5 is a block diagram illustrating the counting unit 222 of the target row generator 22 of the row-determining circuit 2 in accordance with some embodiments of the present disclosure. Referring to FIG. 5, in some embodiments, the counting unit 222 includes a plurality of counting blocks 2221 connected to the processing unit 221, and each of the plurality of counting blocks 2221 is configured to determine a target row (Tr) for a corresponding one of the plurality of banks 911 (see FIG. 2A). In some embodiments, each of the plurality of counting blocks 2221 includes a plurality of counters and a processor, and the number of counters in the plurality of counters included in each of the counting blocks 2221 is the same as the number of rows in the plurality of rows 9111 (see FIG. 2B) included in each of the plurality of banks 911. In other embodiments, the number of counters in the plurality of counters included in each of the plurality of counting blocks 2221 may be varied.

Referring to FIG. 5, in some embodiments, the number of times that a row 9111 suffers from the row hammer problem is defined as a stressed time. In some embodiments, the plurality of counters of each of the plurality of counting blocks 2221 are configured to count stressed times respectively for each of the plurality of rows 9111. In other embodiments, the configuration of the counting unit 222 may be varied.

Referring to FIG. 5, in some embodiments, the number of counting blocks 2221 is the same as the number of banks in the plurality of banks 911 (see FIG. 2A), while, in other embodiments, such configuration may be varied.

Figure 6:
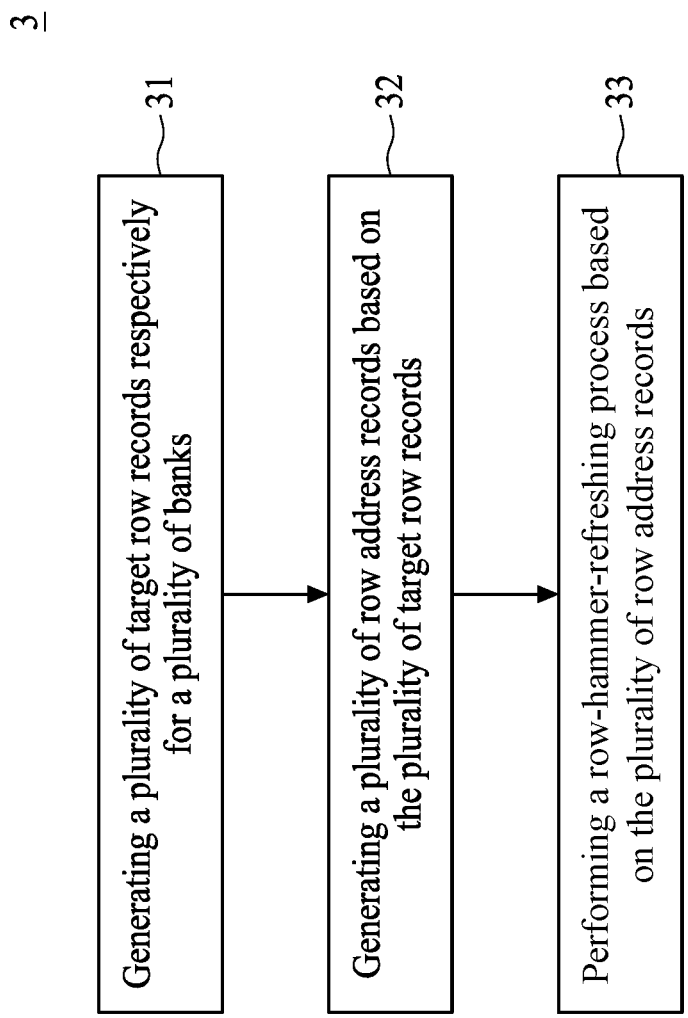
FIG. 6 is a flowchart illustrating a method for refreshing a memory array in accordance with some embodiments of the present disclosure.

FIG. 6 is a flowchart illustrating a method 3 for refreshing the memory array 91 for solving row hammer problems in accordance with some embodiments of the present disclosure. Referring to FIG. 6, the method 3 includes a step 31, in which the plurality of target row records (Rtr) are generated, wherein the plurality of target row records (Rtr) are respectively generated for a plurality of banks; a step 32, in which a plurality of row address records (Rra) are generated based on the plurality of target row records (Rtr); and a step 33, in which a row-hammer-refreshing process is performed based on a corresponding one of the plurality of row address records (Rra), wherein a plurality of target rows in each of the plurality of banks 911 are refreshed.

In some embodiments, a memory-array-refreshing process includes two sub-processes: an auto-refreshing process and a row-hammer-refreshing process. In some embodiments, during the memory-array-refreshing process, the DRAM 9 uses most of its operating time performing the auto-refreshing process, and uses the remaining time performing the row-hammer-refreshing process. In other embodiments, such configuration may be varied.

Referring to FIG. 3, in some embodiments, during the auto-refreshing process, the auto-refresh counter 24 first generates the counting signal (Sc), and the counting signal (Sc) is sent to the row address multiplexer 23 to update the auto-refreshing row address (Aa). Next, the row address multiplexer 23 generates an updated auto-refreshing row address (Aa), and the updated auto-refreshing row address (Aa) is sent to the plurality of row decoders 92 through the plurality of row latches 21. Subsequently, each of the plurality of banks 911 (see FIG. 2A) is refreshed based on the updated auto-refreshing row address (Aa). For example, when the counting signal (Sc) indicates number one, a first row of each of the plurality of banks 911 is refreshed, and when the counting signal (Sc) is updated to indicate number two, a second row of each of the plurality of banks 911 is then refreshed.

Figure 7:
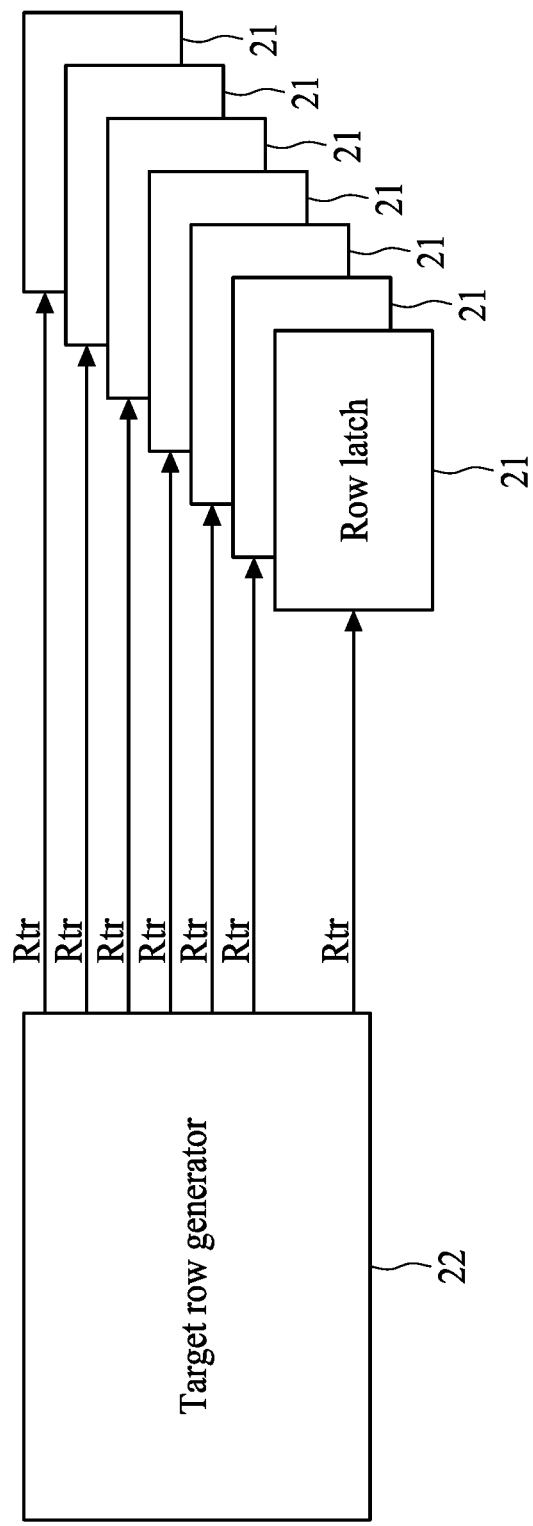
FIG. 7 is a schematic diagram illustrating a relationship between a plurality of row latches and the target row generator of the row-determining circuit in accordance with some embodiments of the present disclosure.

FIG. 7 is a schematic diagram illustrating a relationship between the plurality of row latches 21 and the target row generator 22 of the row-determining circuit 2 in accordance with some embodiments of the present disclosure. Referring to FIG. 7, during the row-hammer-refreshing process, the target row generator 22 first generates the plurality of target row records (Rtr) respectively for the plurality of banks. Next, the plurality of target row records (Rtr) are respectively sent to the plurality of row latches 21, and the plurality of row latches 21 generate the plurality of row address records (Rra) (see FIG. 3). Next, the plurality of row address records (Rra) are sent to the plurality of row decoders 92, and the plurality of row decoders 92 activate respective rows 9111 based on the plurality of row address records (Rra) (see FIG. 3). Subsequently, the plurality of banks 911 are respectively refreshed based on the plurality of row address records (Rra) (see FIG. 2A). In some embodiments, each of the plurality of target row records (Rtr) is sent to a corresponding one of the plurality of row latches 21, such that rows 9111 (see FIG. 2B) that are to be refreshed comprise different rows in the plurality of banks 911.

Referring back to FIG. 5, in some embodiments, during a target-row-determining process, for each of the plurality of counting blocks 2221, if the value of the stressed time of one of the plurality of counters reaches a threshold value, the target row (Tr) is determined by the processor to be the row 9111 (see FIG. 2A), wherein the row 9111 corresponds to the one of the plurality of counters. In some embodiments, after the target row (Tr) is determined, the target row record (Rtr) is sent to the processing unit 221, and the processing unit 221 generates the plurality of target row records (Rtr).

Referring to FIG. 4, in some embodiments, when the processing unit 221 of the target row generator 22 is ready to generate the plurality of target row records (Rtr), the target row record (Rtr) of one of the plurality of counting blocks 2221 is the same as a previous target row record (Rtr) if none of the values of the stressed times of the plurality of counters reaches the threshold value.

Figure 8A:
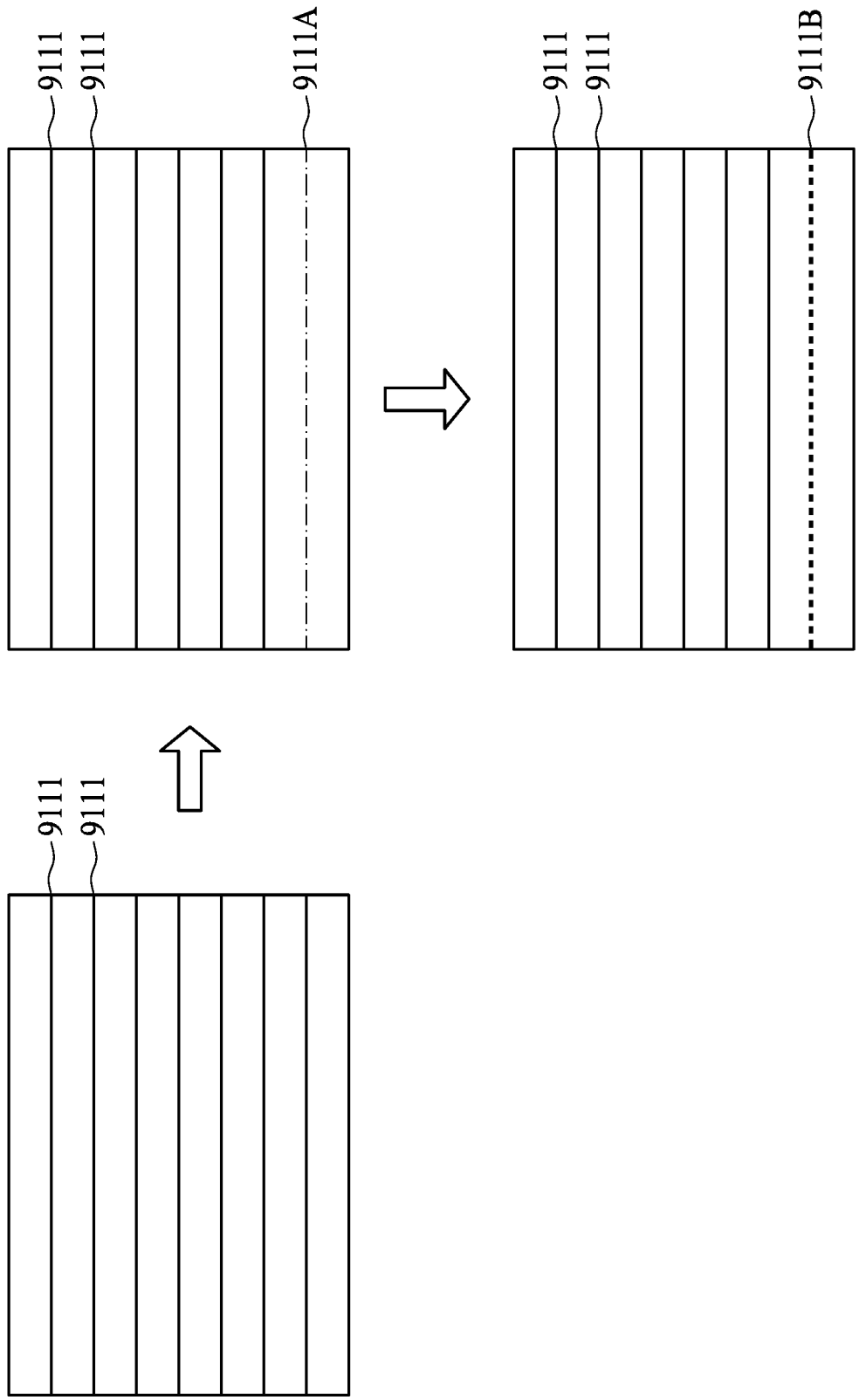
FIG. 8A is a schematic diagram illustrating a plurality of rows of each of a plurality of banks in accordance with some embodiments of the present disclosure.
Figure 8B:
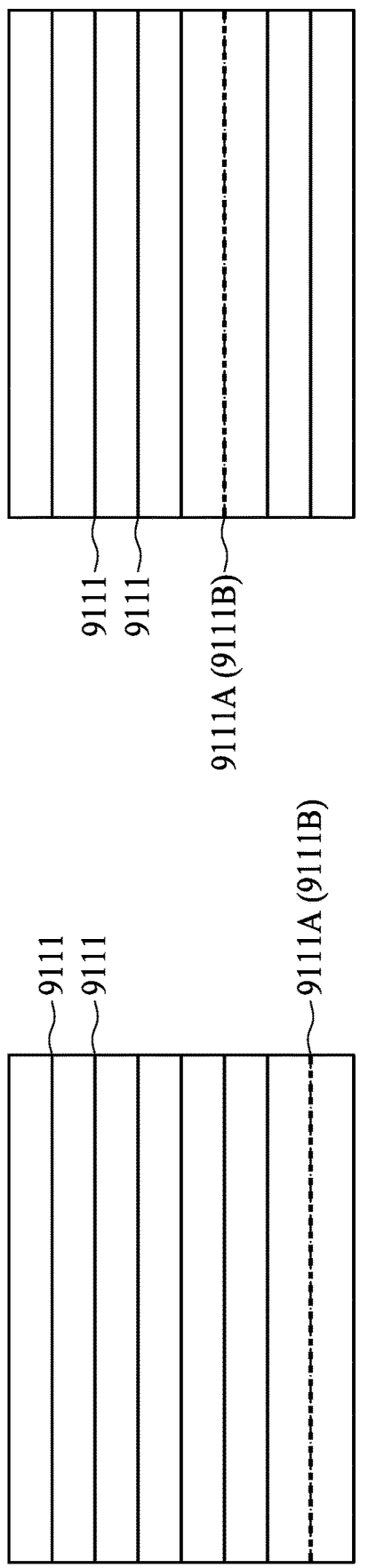
FIG. 8B is a schematic diagram illustrating the plurality of banks that are refreshed for solving the row hammer problems in accordance with some embodiments of the present disclosure.

FIG. 8A is a schematic diagram illustrating the plurality of rows 9111 of each of the plurality of banks 911 in accordance with some embodiments of the present disclosure, and FIG. 8B is a schematic diagram illustrating the plurality of banks 911 that are refreshed for solving the row hammer problems in accordance with some embodiments of the present disclosure. Referring to FIG. 8A, in some embodiments, when one of the rows 9111 exhibits a row hammer problem, the one of the rows 9111 is regarded as a stressed row 9111A. In some embodiments, during the row-hammer-refreshing process, the stressed row 9111A, which is to be refreshed for solving the row hammer problem, is regarded as the target row 9111B.

Referring to FIG. 8B, in some embodiments, since each of the plurality of target row records (Rtr) is generated for the corresponding one of the plurality of banks 911, the stressed row 9111A and the target row 9111B of each of the banks 911 are the same row. Therefore, all of the stressed rows 9111A of the plurality of banks 911 can be refreshed. As a result, the efficiency of the row-hammer-refreshing process is increased.

Figure 9:
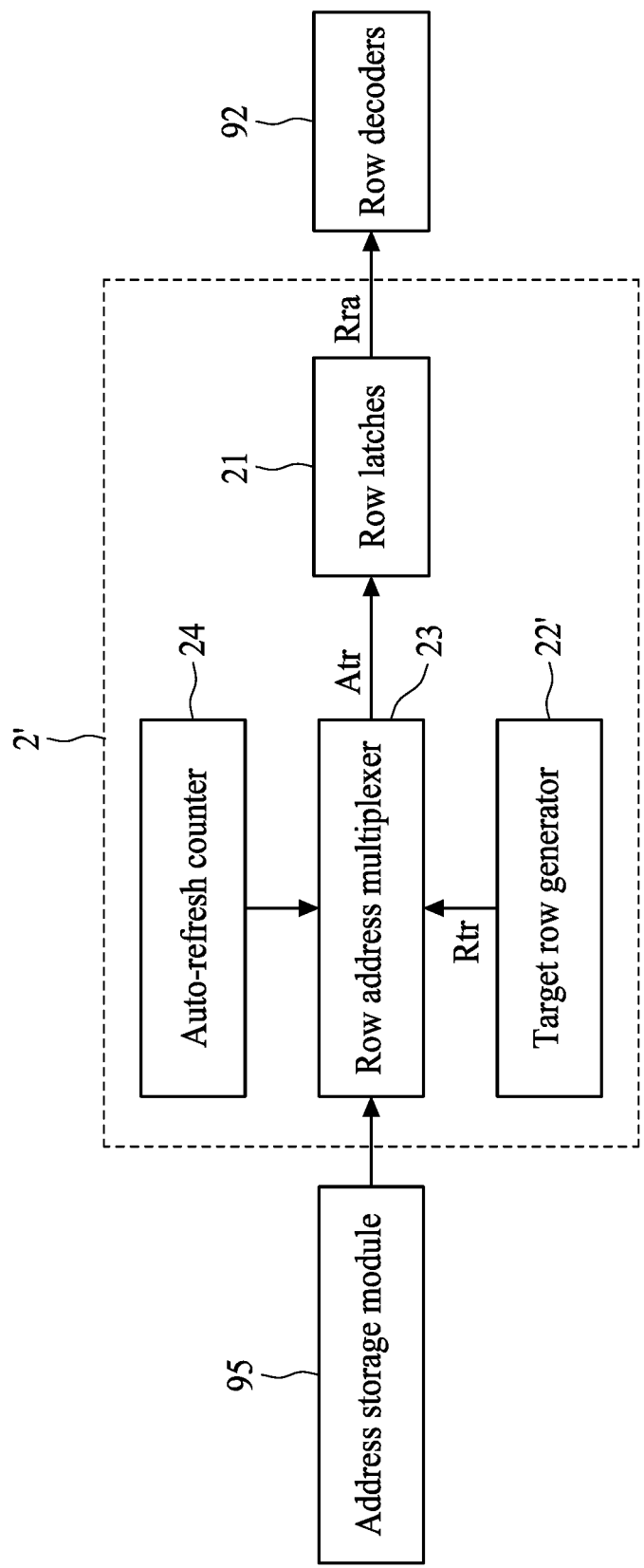
FIG. 9 is a block diagram illustrating a comparative row-determining circuit.

FIG. 9 is a block diagram illustrating a comparative row-determining circuit 2'. Referring to FIG. 9, the comparative row-determining circuit 2' is substantially similar to the row-determining circuit 2 in FIG. 3 except for the target row generator 22'. The target row generator 22' of the comparative row-determining circuit 2' is connected to the row address multiplexer 23 and is configured to generate a target row record (Rtr).

Figure 10:
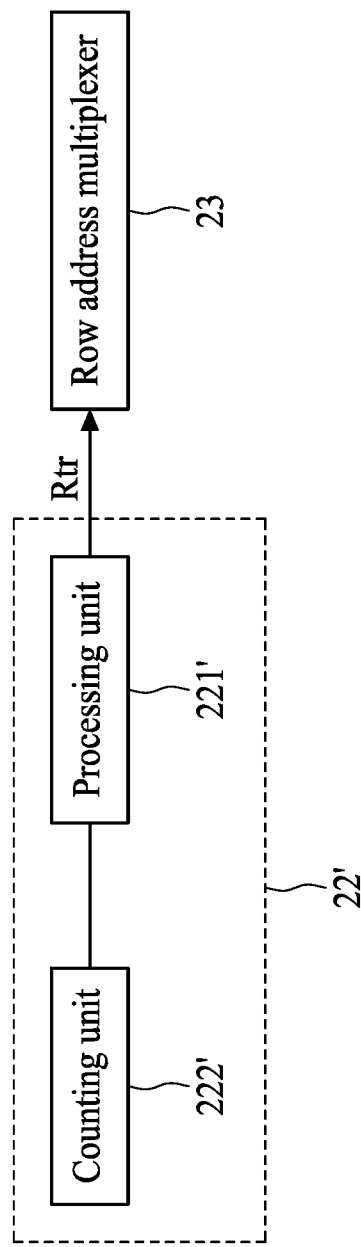
FIG. 10 is a block diagram illustrating a target row generator of the comparative row-determining circuit.

FIG. 10 is a block diagram illustrating the target row generator 22' of the comparative row-determining circuit 2'. Referring to FIG. 10, the target row 22' includes a processing unit 221' and a counting unit 222'. The processing unit 221' is connected to the row address multiplexer 23 and is configured to generate the target row record (Rtr). The counting unit 222' is connected to the processing unit 221' and is configured to generate a plurality of target rows (Tr).

Figure 11:
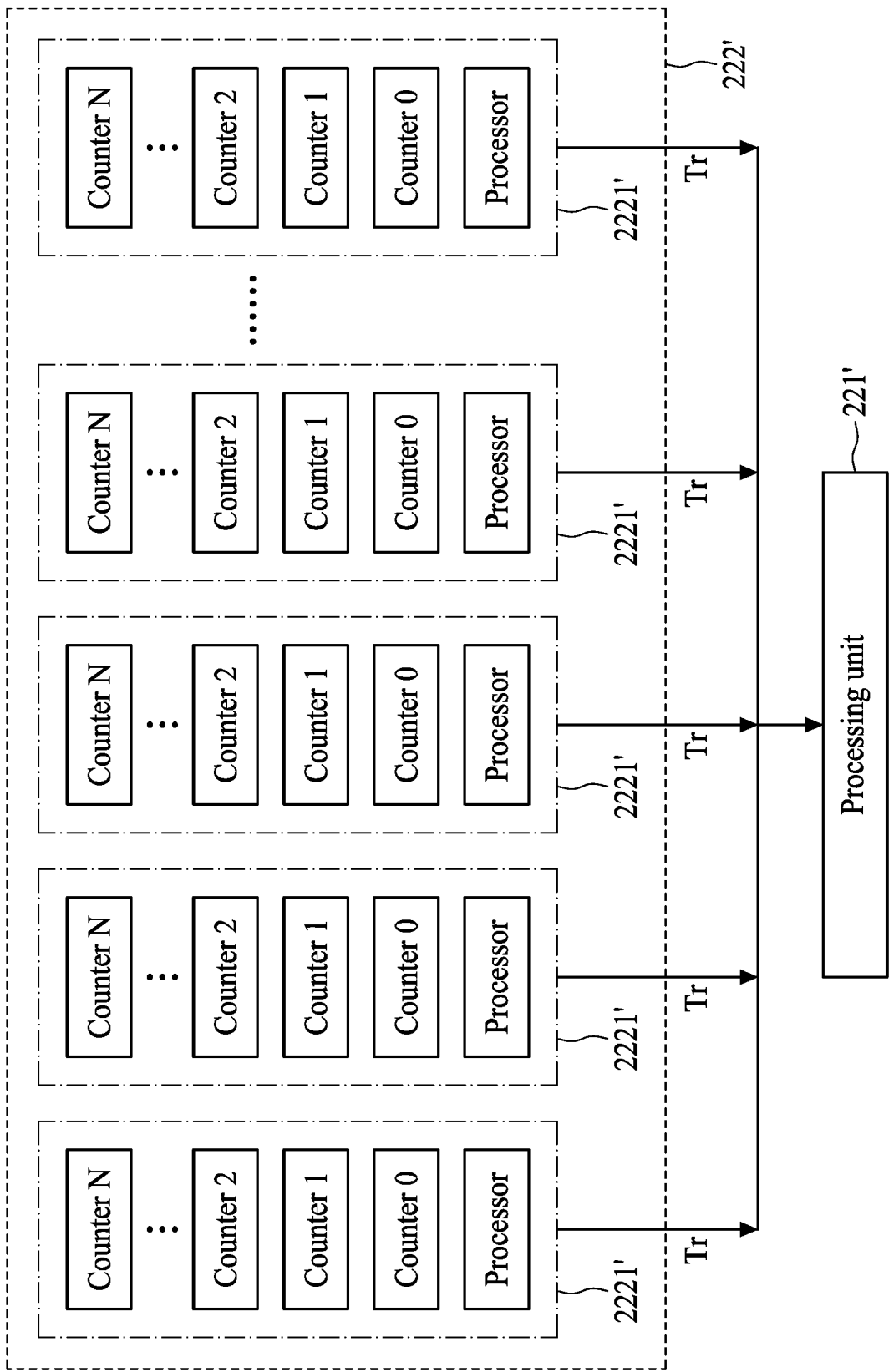
FIG. 11 is a block diagram illustrating a counting unit of the target row generator of the comparative row-determining circuit.

FIG. 11 is a block diagram illustrating the counting unit 222' of the target row generator 22' of the comparative row-determining circuit 2'. Referring to FIG. 11, the counting unit 222' includes a plurality of counting blocks 2221' connected to the processing unit 221', and each of the plurality of counting blocks 2221' is configured to determine a target row (Tr). Each of the plurality of counting blocks 2221' includes a plurality of counters and a processor, and the number of counters in the plurality of counters included in each of the plurality of counting blocks 2221' is the same as the number of rows in the plurality of rows 9111 (see FIG. 2B) of each of the plurality of banks 911 (see FIG. 2A). The plurality of counters of each of the counting blocks 2221' are configured to respectively record the stressed times for the plurality of rows 9111. The number of counting blocks in the plurality of counting blocks 2221' is the same as the number of banks in the plurality of banks 911.

Referring to FIG. 9, during a row-hammer-refreshing process, the target row generator 22' first generates the target row record (Rtr), and the target row record (Rtr) is then sent to the row address multiplexer 23. Next, the row address multiplexer 23 generates a target row address (Atr), and the target row address (Atr) is sent to the plurality of row latches 21. Next, the plurality of row latches 21 generate the plurality of row address records (Rra), and the plurality of row address records (Rra) are sent to the plurality of row decoders 92. Next, the plurality of row decoders 92 activate rows 9111 (see FIG. 2B) based on the plurality of row address records (Rra). Subsequently, each of the plurality of banks 911 (see FIG. 2A) is refreshed based on the plurality of row address records (Rra), and rows 9111 that are to be refreshed comprise the same row in the plurality of banks 911.

Referring to FIG. 11, during a target-row-determining process of the comparative target row generator 22' (see FIG. 10), for each of the plurality of counting blocks 2221', if the value of the stressed time of one of the plurality of counters reaches a threshold value, the target row (Tr) is determined to be the row 9111 (see FIG. 2B), which corresponds to the one of the plurality of counters. After each of the plurality of counting blocks 2221' determines the target row (Tr), the target row (Tr) is sent to the processing unit 221'. Subsequently, the processing unit 221' generates the target row record (Rtr). Since the processing unit 221' sends only one target row record (Rtr) for all of the plurality of banks 911 (see FIG. 2A), the selection by the processing unit 221' of the target row (Tr) from the plurality of counting blocks 2221' is based on the order of time priority. For example, when the third counting block 2221' determines and sends the target row (Tr) to the processing unit 221' earlier than the time at which the other counting blocks 2221' determine and send a target row to the processing unit 221', the processing unit 221' then generates the target row record (Rtr) for all of the plurality of banks 911 based on the target row determined by the third counting block 2221'.

Figure 12:
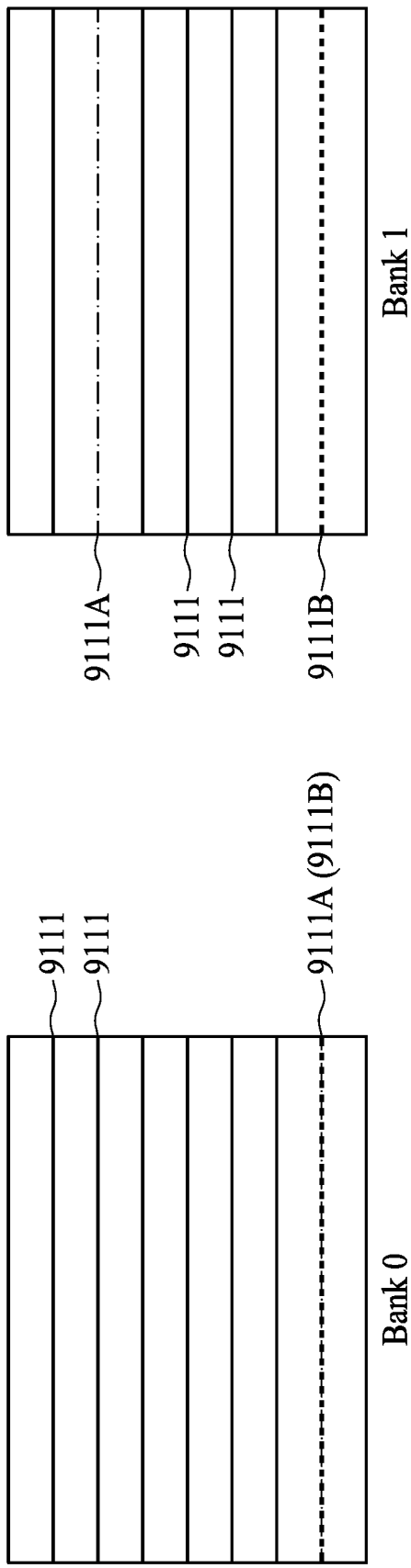
FIG. 12 is a schematic diagram illustrating the plurality of banks of the memory array that are refreshed for solving row hammer problems with a DRAM that includes the comparative row-determining circuit.
Figure 12:
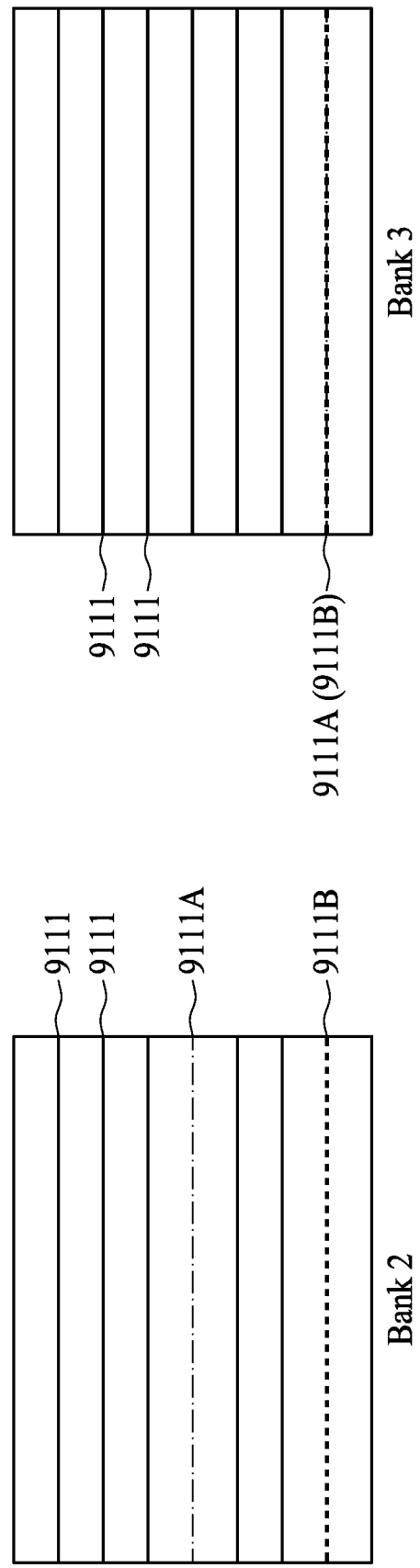

FIG. 12 is another schematic diagram illustrating the plurality of banks 911 that are refreshed for solving the row hammer problems when the DRAM 9 includes the comparative row-determining circuit 2'. Referring to FIG. 12, since the plurality of banks 911 are all refreshed at the same target row (Tr), in some portion of the plurality of banks 911, the stressed row 9111A and the target row 9111B of each of the plurality of banks 911 are the same, and in the remaining portion of the banks 911, the stressed row 9111A and the target row 9111B of each of the plurality of banks 911 are different. Therefore, the stressed rows 9111A of the remaining portion of the plurality of banks 911 are not refreshed. As a result, the efficiency of the row-hammer-refreshing process is low.

In the comparative row-determining circuit 2', the target row generator 22' generates only one target row record (Rtr). Therefore, rows 9111 that are to be refreshed comprise the same row in the plurality of banks 911. In contrast, the target row generator 22 of the present disclosure generates the plurality of target row records (Rtr). Therefore, the rows 9111 that are to be refreshed comprise different rows in the plurality of banks 911. As a result, the efficiency of the row-hammer-refreshing process can be improved.

In conclusion, in some embodiments of the present disclosure, with the configuration of the row-determining circuit 2, the row-hammer-refreshing can be performed to refresh different rows 9111 in the plurality of banks 911 for solving row hammer problems. As a result, the efficiency of the row-hammer-refreshing process is increased.

In some embodiment, the present disclosure provides a row-determining circuit including a plurality of row latches and a target row generator connected to the plurality of row latches. In some embodiments, the target row generator is configured to generate a plurality of target row records respectively for a plurality of banks. In some embodiments, the target row generator is configured to send the plurality of target row records respectively to the plurality of row latches, and the plurality of row latches are configured to generate a plurality of row address records based on the plurality of target row records.

In some embodiments, the present disclosure provides a DRAM includes a memory array and a row-determining circuit. In some embodiments, the memory array includes a plurality of banks, and the row-determining circuit is connected to the plurality of banks. In some embodiments, the row-determining circuit includes a plurality of row latches and a target row generator. In some embodiments, the target row generator is configured to generate a plurality of target row records respectively for a plurality of banks. In some embodiments, the target row generator is configured to send the plurality of target row records respectively to the plurality of row latches, and the plurality of row latches are configured to generate a plurality of row address records based on the plurality of target row records.

In some embodiments, the present disclosure provides a method for refreshing a memory array. The method includes the following steps: generating a plurality of target row records respectively for a plurality of banks; generating a plurality of row address records based on the plurality of target row records; and performing a row-hammer-refreshing process based on the plurality of row address records.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for refreshing a memory array, comprising:
generating a plurality of target row records respectively for a plurality of banks;
generating a plurality of row address records based on the plurality of target row records;
performing a row-hammer-refreshing process based on the plurality of row address records;
generating a counting signal to update an auto-refresh row address;
generating an updated auto-refreshing row address from the auto-refresh row address; and
performing an auto-refresh process to refresh each of the plurality of banks based on the updated auto-refreshing row address.

2. The method of claim 1, wherein generating the plurality of target row records comprises counting stressed times respectively for a plurality of rows in the plurality of banks.

3. The method of claim 1, wherein the plurality of row address records direct to different rows in the plurality of banks.

4. The method of claim 1, wherein the row-hammer-refreshing process comprises activating a plurality of target rows in the plurality of banks based on the plurality of row address records.

* * * * *